United States Patent [19]

Ackerman

[11] Patent Number: 5,494,704
[45] Date of Patent: Feb. 27, 1996

[54] LOW TEMPERATURE CHEMICAL VAPOR DEPOSITION OF PROTECTIVE COATING CONTAINING PLATINUM

[75] Inventor: John F. Ackerman, Cheyenne, Wyo.

[73] Assignee: General Electric Company, Schenectady, N.Y.

[21] Appl. No.: 317,048

[22] Filed: Oct. 3, 1994

[51] Int. Cl.$^6$ .............................. B05D 7/22; C23C 16/00
[52] U.S. Cl. .................. 427/237; 427/238; 427/239; 427/250; 427/253; 427/255.1; 427/255.2; 427/255.7; 427/124; 427/125; 427/383.7
[58] Field of Search ................... 427/250, 252, 427/255.1, 255.2, 125, 124, 383.7, 253, 255.7, 237, 238, 239; 428/908.8

[56] References Cited

U.S. PATENT DOCUMENTS

| | | | |
|---|---|---|---|
| 5,130,172 | 7/1992 | Hicks et al. | 427/252 |
| 5,139,824 | 8/1992 | Liburdi et al. | 427/252 |

FOREIGN PATENT DOCUMENTS 61-131250  6/1986  Japan.

OTHER PUBLICATIONS

John L. Vossen, and Werner Kern, "Thin Film Processes," Academic Press, (1978) pp. 258–331.
Sasaoka et al, Appl. Phys. Lett. 55(8), Aug. 1989, pp. 741–743.
Vargas et al, Appl. Phys. Lett. 65(9), Aug. 1994, pp. 1094–1096.

*Primary Examiner*—Roy V. King
*Attorney, Agent, or Firm*—Noreen C. Johnson; James Magee, Jr.

[57] ABSTRACT

A method is disclosed to deposit aluminum and platinum on substrates for improved corrosion, oxidation, and erosion protection. Low temperature chemical vapor deposition is used. A homogeneous biphase coating of aluminum and platinum may be deposited, as well as sequential layers of aluminum and platinum.

10 Claims, No Drawings

LOW TEMPERATURE CHEMICAL VAPOR DEPOSITION OF PROTECTIVE COATING CONTAINING PLATINUM

FIELD OF THE INVENTION

The present invention relates to a method for protecting substrate surfaces by depositing aluminum with platinum onto nickel-based, cobalt-based, and iron-based alloys and subsequently heat-treating the aluminum based deposits to form metal aluminide protective coatings.

BACKGROUND OF THE INVENTION

Coatings from chemical vapor deposition, herein sometimes referred to as CVD, are used extensively in applications requiring resistance to wear, erosion, and corrosion over a wide range of temperatures. More often than not, the purpose of the coating is multifunctional. An example is the coating for a turbine parts, such as blades and vanes, to provide protection against wear and erosion of a corrosive environment at high temperature as well as protection against erosion by sand and other foreign particles. Aluminum is often the coating material chosen to protect turbine hardware involving the formation of aluminum oxide ($Al_2O_3$) and metal-aluminum oxide layers.

Copending and commonly assigned U.S. application, "Low Temperature Chemical Vapor Deposition Method for Cleaning Substrate and Depositing Protective Coating," Ser. No. 08/315,807 filed Sep. 30, 1994, teaches a method to deposit aluminum coatings on turbine blades. Another copending and commonly assigned U.S. application, "Method for Low Temperature Chemical Vapor Deposition of Aluminides Containing Easily Oxidized Metals," Ser. No. 08/315,805 filed Sep. 30, 1994, discloses depositing metal oxides with an excess of aluminum. The metal oxides are subsequently reduced by aluminum to form aluminum coatings containing small amounts of metal.

In addition to using aluminum as a protective coating, it has been found that small amounts of platinum in the aluminum coating produce superior passivating films upon oxidation. The stability of the films further protect substrate metals from high temperature corrosion. Although platinum can be plasma sprayed or evaporated, it is not easily deposited by other physical vapor deposition methods.

It would be advantageous to have a method to co-deposit platinum with aluminum by low temperature chemical vapor deposition. Low temperature chemical vapor deposition allows uniform deposition of the coating within internal cooling passages of turbine hardware at temperatures which are not detrimental to the mechanical strength of the substrate material.

It would also be advantageous to have a method to form aluminide coatings that contain small amounts of platinum.

SUMMARY OF THE INVENTION

The present invention provides a method to deposit a homogeneous biphase mixture of aluminum and platinum on a substrate by low temperature chemical vapor deposition, thereby providing uniform coverage of internal and external surface areas of substrates.

The method of the present invention is directed to coating internal and external surfaces of a substrate with a homogeneous biphase protective coating, said method comprising: depositing simultaneously on the surfaces of the substrate by low temperature chemical vapor deposition at a temperature up to about 600° C., a homogeneous biphase mixture comprising aluminum and platinum, where said aluminum is deposited in a stoichiometric amount greater than or equal to a ten fold excess of platinum from an aluminum alkyl halide precursor, and where said platinum is deposited from a precursor selected from the group consisting of platinum Beta-diketonates and dialkyl platinum dienes.

The terms "homogeneous biphase coating" or "homogeneous biphase mixture", as used herein, mean the aluminum and platinum are codeposited on a substrate surface in an amount specified by the desired application of the coating, where the aluminum in the coating or mixture is at least ten times the amount of the platinum present in the coating or mixture. The term "platinum" means platinum metal.

Additionally, the present invention is directed towards a method to protect internal and external surfaces of a substrate with alternating layers of aluminum and platinum, said method comprising: (a) depositing on the surfaces of said substrate a layer of aluminum by low temperature chemical vapor deposition at a temperature up to about 500° C., where said aluminum layer is about 0.5–200 microns thick, from an aluminum alkyl halide precursor, and deposited in a stoichiometric amount greater than or equal to a ten fold excess of platinum; (b) depositing on said aluminum layer, a platinum layer by low temperature chemical vapor deposition at a temperature up to about 600° C., where said platinum layer is about 0.005–2.0 microns thick and is deposited from a platinum precursor selected from the group consisting of platinum Beta-diketonates and dialkyl platinum dienes; and (c) repeating steps (a) and (b) until a total thickness of about 25–1250 microns is deposited.

An important advantage of the invention is the improved corrosion resistance of the substrate by the aluminum and platinum coating. Another important aspect of the present invention is the broad spectrum of substrate materials that can be utilized due to the low deposition temperature.

Additional advantages of the present invention include the high throwing power of the CVD process, the uniform coverage of hard to reach internal passages of turbine parts due to the utilization of a flowing process, and the elimination of a heat treating step to regenerate the original substrate microstructure when different high temperature CVD processes (about 1100° C.) are used.

DETAILED DESCRIPTION OF THE INVENTION

In the above methods of the present invention, the aluminum and platinum are deposited by low temperature chemical vapor deposition. The low temperature chemical vapor deposition is conducted in accordance with methods known to those skilled in the art. The term "low temperature" chemical vapor deposition, as used herein, means that the temperature of the chemical vapor deposition is about 600° C. or lower, depending on the precursors chosen.

The present invention also provides a means of providing corrosion resistant aluminides on superalloys. After the co-deposition of the aluminum and platinum metal onto the substrate, the coated substrate is heated to form an aluminide containing a small percentage of platinum.

The time to deposit the aluminum and platinum is dependent on the desired thickness of the homogeneous biphase coating and the operational parameters chosen to run the deposition process. Generally, a thickness for the coating is specified per part or application and one skilled in the art is then able to ascertain the deposition parameters. For example, for protective coatings on turbine parts exposed to in-service temperatures around 1100° C., a suitable thickness for the biphase homogeneous mixture of aluminum and platinum may be about 25–1250 microns. Likewise, when practicing this invention by alternating layers of aluminum and platinum, a total thickness of the combined layers is about 25–1250 microns.

Substrates include, but are not limited to, nickel based, cobalt based, and iron based alloys. The alloys may be cast or wrought superalloys. Examples of such substrates are GTD-111, GTD-222, Rene 80, Rene 41, Rene 125, Rene 77, Rene 95, Inconel 706, Inconel 718, Inconel 625, cobalt-based HS188, cobalt-based L-605, and stainless steels. The process is especially suited for coating parts and hardware used in turbines. An example of a turbine part would be a turbine blade or vane.

Additional substrate materials, that can accommodate an aluminum-platinum coating for applications other than turbine parts, may be used in this invention. For instance, it is also contemplated that this invention may be utilized for coatings in marine environments, electronic applications, and power generators, such as gas, steam, and nuclear, to mention a few.

The present invention is applicable to any known process for the low temperature chemical vapor deposition of aluminum and platinum on a substrate. The following detailed description of the invention referring to one type of vapor deposition process is representative of the practice of the invention using other types of conventional low temperature CVD processes with aluminumalkyl halides and platinum Beta-diketonates or dialkyl platinum dienes.

Aluminum is deposited from a precursor such as an aluminum alkyl halide. The aluminum alkyl halide can be a chloride, bromide or iodide compound so long as it is stable at about 25° C. In the chemical vapor deposition reactor, the aluminum precursor is stored in a effusion cell separate from the platinum precursor.

The platinum codeposited with the aluminum in the process may be selected from precursors which are generally platinum Beta-diketonates or dialkyl platinum dienes. For example, platinum is deposited from platinum bis-(acetyl-acetonate) or dimethyl platinum cyclopentadienide. In the CVD reaction chamber, the platinum precursor is stored in a separate effusion cell than the aluminum precursor effusion cell. This means that the CVD reactor has at least two effusion cells, one with an aluminum precursor and one with a platinum precursor.

During deposition of a homogeneous biphase mixture of aluminum and platinum, the aluminum is deposited in at least a ten fold stoichiometric excess of the platinum, and preferably a 99 fold stoichiometric excess. For instance, the deposit would have 99 moles of aluminum to 1 mole of platinum. The parameters of the CVD reaction are run to control the amount of aluminum and platinum deposited, based on the desired excess of aluminum required by the application of the coating on the article. The total thickness of the codeposition of aluminum and platinum is generally between about 25–1250 microns, but is not limited to only this thickness range.

When alternating layers of aluminum and platinum are deposited, each layer is controlled by its thickness. Aluminum is deposited from a separate effusion cell in the CVD reactor at a temperature up to about 500° C. until about 0.50–200 microns is deposited. The effusion cell with the aluminum precursor is then closed, and the effusion cell with the platinum precursor is opened. At a temperature up to about 600° C., the platinum is deposited onto the aluminum layer in an amount much smaller than the aluminum, generally between about 0.005–2.0 microns. By closing the platinum precursor effusion cell and reopening the aluminum precursor cell, the process is repeated with alternating layers of aluminum and platinum until a total thickness is achieved. Such thickness is dictated by the application of the coating and its specified thickness.

The above thickness ranges for the homogeneous biphase deposition method and the alternating layer deposition method are given as examples for turbine parts. Other thickness ranges may be used depending on the application of the coating.

In the practice of the present invention, the metal substrate must be thick enough to later form an aluminide layer on its surface. Depending on the metal substrate, the aluminide forms after the deposition of aluminum and platinum and subsequent interdiffusion of the aluminum and the substrate base metal during heat-treatment. During and after the heat-treatment, the aluminide contains small amounts of the platinum.

The temperature employed during the chemical vapor deposition process is about 600° C. or less, with the preferred range between about 100°–500° C., and the most preferred range between about 280°–420° C.

An example of a CVD apparatus for the practice of this invention consists of effusion cells with plumbing fixtures capable of volatilizing and bringing to the substrate a sufficient quantity of the aluminum precursor and the platinum precursor to coat the substrate with aluminum and platinum.

One or more substrates may be coated at the same time. The apparatus has an airtight reactor volume which contains the substrate and a heating means for the substrate. The heating means is chosen from conventional methods known to those skilled in the art, including, but not limited to, resistive heating, induction heating by radio frequency (RF), and fuel fired furnaces. Additionally, the CVD apparatus has a system of traps, condensers, and vacuum pumps capable of maintaining a vacuum in the reactor and effusion cell during the process. The substrate is fixed to the effusion cell outlet in a manner as to force a majority of the precursor vapor through the internal passages of the substrate. Common engineering principles, known in the art, can be used for this purpose.

In a normal run of the CVD process, the substrate is placed in the reactor, the reactor evacuated to 10–15 millitorr (mtorr) pressure to remove oxygen, and then heated to the reaction temperature. After the reactor is evacuated, the process may be run at a pressure between about 10 millitorr to about 10 torr. A preferred range is between about 100–500 millitorr.

The reaction temperature is dependent on the volatilization temperatures of the precursors. Different organic halides vaporize at different temperatures. For instance, when diethyl aluminum chloride is the precursor, the chemical vapor deposition temperature is chosen between about 300°–400° C. The vaporization temperatures of aluminum alkyl halides and the platinum precursors can be obtained from chemical handbooks displaying physical properties of chemical compounds.

When the reactor is at the selected reaction temperature, the effusion cells are opened simultaneously where the aluminum alkyl halide vapors and platinum precursor vapors pass through the plumbing into the heated zone. Upon passing into the heated zone, the vapors surround the external portions of the substrate and penetrate the internal substrate passages. An alternate method is depositing an aluminum layer and a platinum layer where the effusion cells are opened sequentially. This means that when one cell is open the other cell is closed.

The following example further demonstrates the invention.

EXAMPLE 1

This is for the deposition of aluminum and platinum by alternating-the layers. During operation by low temperature chemical vapor deposition, the substrate to be coated is placed into a tube area where vapors react to deposit the aluminum and platinum on the substrate. The tube area is evacuated to remove oxygen to twenty millitorr and the furnace which surrounds the tube, is brought to about 440° C. The aluminum is deposited according to the above mentioned method. After the aluminum is deposited in an amount of about 1 micron thick, the aluminum effusion cell is closed. The furnace is left at about 440° C. At this point, the platinum bis-(acetylacetonate) in the effusion cell is heated to 165° C. When it reaches that temperature, the valve connecting it to the tube holding the substrates is opened and the vapors of the platinum precursor are allowed to pass into the tube and over the substrate. The total pressure in the tube is about 100 millitorr. The vapors decompose to form platinum on the aluminum layer. Some carbon may deposit as an impurity. The rate of deposition under these conditions is one Angstrom per second. About 100 Angstroms of platinum are deposited. When the desired thickness of platinum is deposited, the valve leading from the effusion cell is closed. The process is repeated to deposit the aluminum layer onto the platinum layer, and so on. After the final layer is deposited, the effusion cells are both closed and the pressure control valve is opened. The furnace power is disconnected. After several hours, the apparatus will cool to ambient temperatures. Then, the vacuum pump is turned off and the system is pressurized to atmospheric pressure. The tube is then opened and the coated substrates extracted.

What is claimed is:

1. A method to form an aluminide layer on internal and external surfaces of a metal substrate with a homogeneous biphase protective coating, said method comprising: depositing simultaneously aluminum and platinum to form a homogeneous biphase mixture of about 25 to 1250 microns thick on the surfaces of the metal substrate by low temperature chemical vapor deposition at a temperature up to about 600° C., where said aluminum is deposited in a stoichiometric amount greater than or equal to a ten fold excess of platinum from an aluminum alkyl halide precursor, and where said platinum is deposited from a precursor selected from the group consisting of platinum beta-diketonates and dialkyl platinum dienes; and then heating the coated metal substrate to interdiffuse the aluminum and platinum with the metal substrate to form an aluminide layer containing trace amounts of platinum.

2. A method according to claim 1 where said metal substrate is selected from the group consisting of a nickel based alloy, a cobalt based alloy, and a iron based alloy.

3. A method according to claim 1 where said aluminum alkyl halide precursor is selected from the group consisting of aluminum alkyl chloride, aluminum alkyl bromide, and aluminum alkyl iodide.

4. A method according to claim 3 where said aluminum alkyl chloride is diethyl aluminum chloride, said platinum beta-diketonate is platinum bis-(acetylacetonate), and said dialkyl platinum diene is dimethyl platinum cyclopentadienide.

5. A method to form an aluminide layer to protect internal and external surfaces of a metal substrate with alternating layers of aluminum and platinum, said method comprising:

(a) depositing on the surfaces of said metal substrate a layer of aluminum by low temperature chemical vapor deposition at a temperature up to about 500° C., where said aluminum layer is about 0.5–200 microns thick, from an aluminum alkyl halide precursor, and deposited in a stoichiometric amount greater than or equal to a ten fold excess of platinum;

(b) depositing on said aluminum layer, a platinum layer by low temperature chemical vapor deposition at a temperature up to about 600° C., where said platinum layer is about 0.005– 2.0 microns thick and is deposited from a precursor selected from the group consisting of platinum beta-diketonates and dialkyl platinum dienes;

(c) repeating steps (a) and (b) until a total thickness of about 25–1250 microns is deposited; and then (d) heating the coated metal substrate to interdiffuse the aluminum and platinum with the metal substrate to form an aluminide layer containing trace amounts of platinum.

6. A method according to claim 5 where said metal substrate is selected from the group consisting of a nickel based alloy, a cobalt based alloy, and a iron based alloy.

7. A method according to claim 5 where said aluminum alkyl halide precursor is selected from the group consisting of aluminum alkyl chloride, aluminum alkyl bromide, and aluminum alkyl iodide.

8. A method according to claim 7 where said aluminum alkyl chloride is diethyl aluminum chloride, said platinum beta-diketonate is platinum bis-(acetylacetonate), and said dialkyl platinum diene is dimethyl platinum cyclopentadienide.

9. A method according to claim 2 where said metal substrate is a turbine part or a part for a gas, steam, or nuclear power generator.

10. A method according to claim 6 where said metal substrate is a turbine part or a part for a gas, steam, or nuclear power generator.

* * * * *